(12) United States Patent
England et al.

(10) Patent No.: US 9,553,058 B1
(45) Date of Patent: Jan. 24, 2017

(54) WAFER BACKSIDE REDISTRIBUTION LAYER WARPAGE CONTROL

(71) Applicant: GLOBALFOUNDRIES Inc., Grand Cayman (KY)

(72) Inventors: Luke England, Saratoga Springs, NY (US); Rahul Agarwal, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/854,565

(22) Filed: Sep. 15, 2015

(51) Int. Cl.
    *H01L 23/00* (2006.01)
    *H01L 23/48* (2006.01)

(52) U.S. Cl.
    CPC ............ *H01L 24/03* (2013.01); *H01L 23/481* (2013.01); *H01L 24/06* (2013.01); *H01L 2224/0231* (2013.01); *H01L 2224/0239* (2013.01); *H01L 2224/0401* (2013.01); *H01L 2924/35* (2013.01)

(58) Field of Classification Search
    CPC .............. H01L 2224/0235; H01L 2224/02373; H01L 2224/06157
    See application file for complete search history.

(56) References Cited

U.S. PATENT DOCUMENTS

| | | | |
|---|---|---|---|
| 6,551,856 B1 * | 4/2003 | Lee | ................... H01L 23/53228 257/747 |
| 6,894,399 B2 * | 5/2005 | Vu | .......................... H01L 23/16 257/786 |
| 8,298,944 B1 | 10/2012 | West | |
| 2014/0124900 A1 | 5/2014 | West et al. | |
| 2015/0048500 A1 * | 2/2015 | Yu | ........................... H01L 24/19 257/737 |

* cited by examiner

*Primary Examiner* — Daniel Whalen
(74) *Attorney, Agent, or Firm* — Ditthavong & Steiner, P.C.

(57) ABSTRACT

A method of forming a network of RDL lines on the backside of a thinned TSV die to control warpage and the resulting device are provided. Embodiments include providing a thinned TSV die of a 3D IC stack, the thinned TSV die having a front side and a back side; forming a plurality of RDL lines across the backside of the die; and forming a plurality of UBM structures across the backside of the die.

16 Claims, 3 Drawing Sheets

WAFER BACKSIDE REDISTRIBUTION LAYER WARPAGE CONTROL

TECHNICAL FIELD

The present disclosure relates to device wafer packaging. The present disclosure is particularly applicable to packaging of through-silicon-via (TSV) dies in three dimensional (3D) integrated circuit (IC) stacks.

BACKGROUND

Flip-chip attachment of large thin dies with TSVs for 3D applications often results in warpage control issues when a mass reflow process is used. Bottom die warpage can prevent top die attachment when micropillars are used as the interconnect since a near flat surface is required on the backside of the bottom die. Warpage is more severe with higher numbers of back-end-of-line (BEOL) layers.

A need therefore exists for methodology enabling warpage control on the backside of a thinned TSV die and the resulting device.

SUMMARY

An aspect of the present disclosure is a method of forming a network of redistribution layer (RDL) lines on the backside of a thinned TSV die to control warpage.

Another aspect of the present disclosure is a device including a thinned TSV die having an RDL structure formed on the backside of the die to control warpage.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a thinned TSV die of a 3D IC stack, the thinned TSV die having a front side and a back side; forming a plurality of RDL lines across the backside of the die; and forming a plurality of under bump metal (UBM) structures across the backside of the die.

Aspects of the present disclosure include forming the RDL lines in a standard grid, a modified grid, in parallel, or as a plated layer with a plurality of openings. Other aspects include forming the RDL lines with a high compressive stress. Further aspects include forming the UBM structures between or on the RDL lines. Another aspect includes wherein the UBM structures are formed between the RDL lines, forming a plurality of UBM capture pads on the backside of the die between the RDL lines, the UBM capture pads being formed at the same time as the RDL lines are formed; and forming each UBM structure on top of a UBM capture pad. Additional aspects include forming the UBM capture pads with at least a 1 micrometer ($\mu m$) gap between each UBM capture pad and the RDL lines. Other aspects include forming the UBM capture pads and the RDL lines of copper (Cu). Further aspects include forming a power delivery network redistribution layer (PDN RDL) between the RDL lines on the backside of the die. Another aspect includes forming one or more of the UBM structures on the PDN RDL.

Another aspect of the present disclosure is a device including: a thinned TSV die of a 3D IC stack, the TSV die having a front side and a back side; a plurality of RDL lines formed across the backside of the die; and a plurality of UBM structures formed across the backside of the die.

Aspects of the device include the RDL lines being formed in a standard grid, a modified grid, in parallel, or as a plated layer with a plurality of openings. Other aspects include the RDL lines being formed with a high compressive stress. Further aspects include the UBM structures being formed between or on the RDL lines. Another aspect includes the UBM structures being formed between the RDL lines, a plurality of UBM capture pads being formed between the RDL lines on the backside of the die between the RDL lines at the same time that the RDL lines are formed, and each UBM structure being formed on top of a UBM capture pad. Additional aspects include the UBM capture pads being formed with at least a 1 $\mu m$ gap between each UBM capture pad and the RDL lines. Other aspects include the UBM capture pads and the RDL lines being formed of Cu. Further aspects include a PDN RDL being formed between the RDL lines on the backside of the die. Another aspect includes one or more of the UBM structures being formed on the PDN RDL.

A further aspect of the present disclosure is a method including: providing a thinned TSV die of a 3D IC stack, the thinned TSV die having a front side and a back side; forming a plurality of RDL lines across the backside of the die, the RDL lines being formed of Cu with a high compressive stress and in a standard grid, a modified grid, in parallel, or as a plated layer with a plurality of openings; forming a plurality of UBM capture pads of Cu on the backside of the die, the plurality of UBM capture pads being formed at the same time as the RDL lines are formed and with at least a 1 $\mu m$ gap between each UBM capture pad and the RDL lines; and forming a plurality of UBM structures across the backside of the die, each UBM structure formed on top of a UBM capture pad. Aspects of the present disclosure include wherein the RDL lines are formed in a modified grid, forming a PDN RDL between the RDL lines on the backside of the die; and forming one or more of the UBM structures on the PDN RDL.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of warpage control issues attendant upon using a mass reflow process for flip-chip attachment of a large thin die with TSVs in a 3D IC.

Methodology in accordance with embodiments of the present disclosure includes providing a thinned TSV die of a 3D IC stack, the thinned TSV die having a front side and a back side. A plurality of RDL lines are formed across the backside of the die, and a plurality of UBM structures are formed across the backside of the die.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
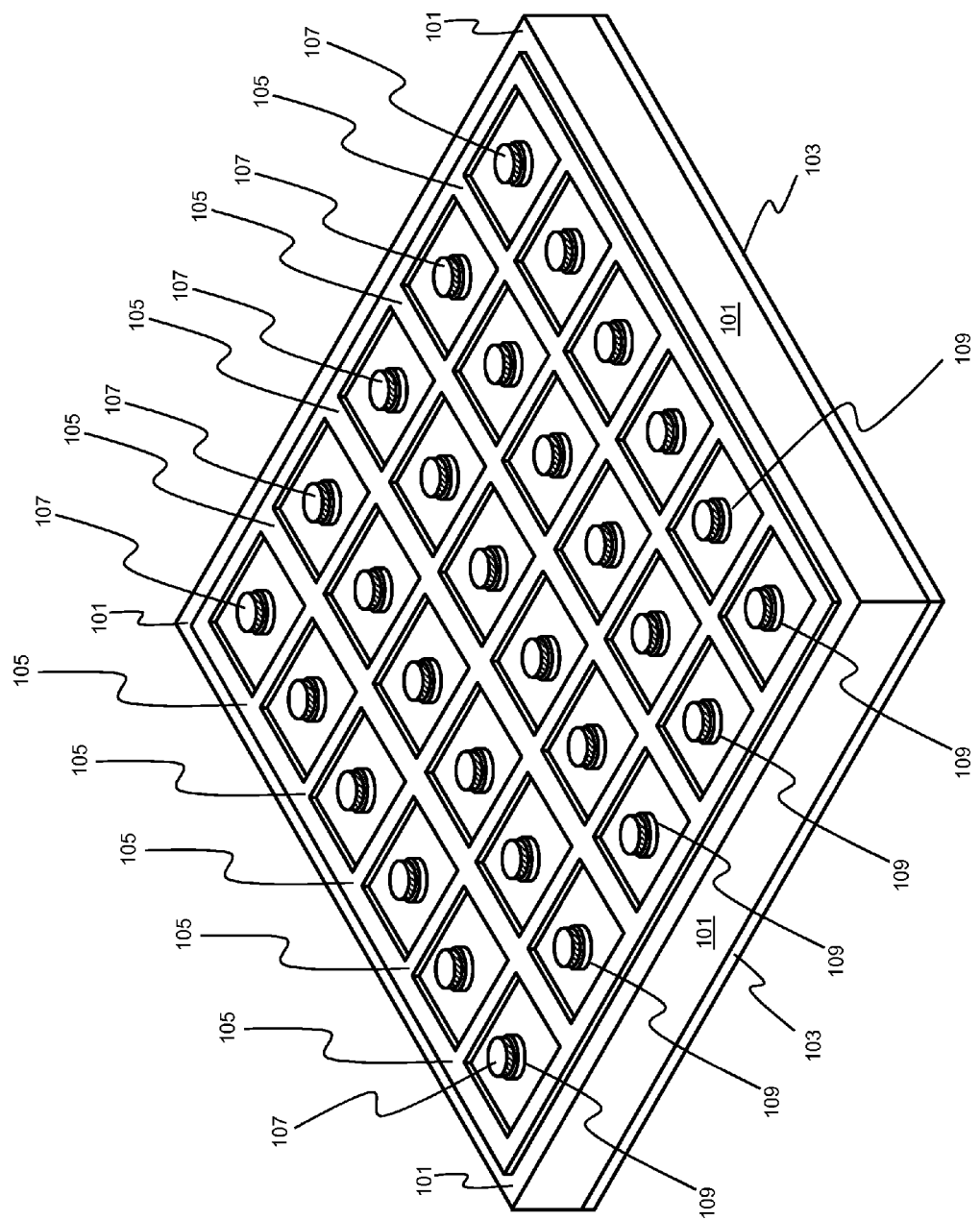
FIGS. 1A and 1B schematically illustrate examples of a thinned TSV die having a RDL structure formed on the backside of the die to control warpage, in accordance with an exemplary embodiment.
Figure 1B:
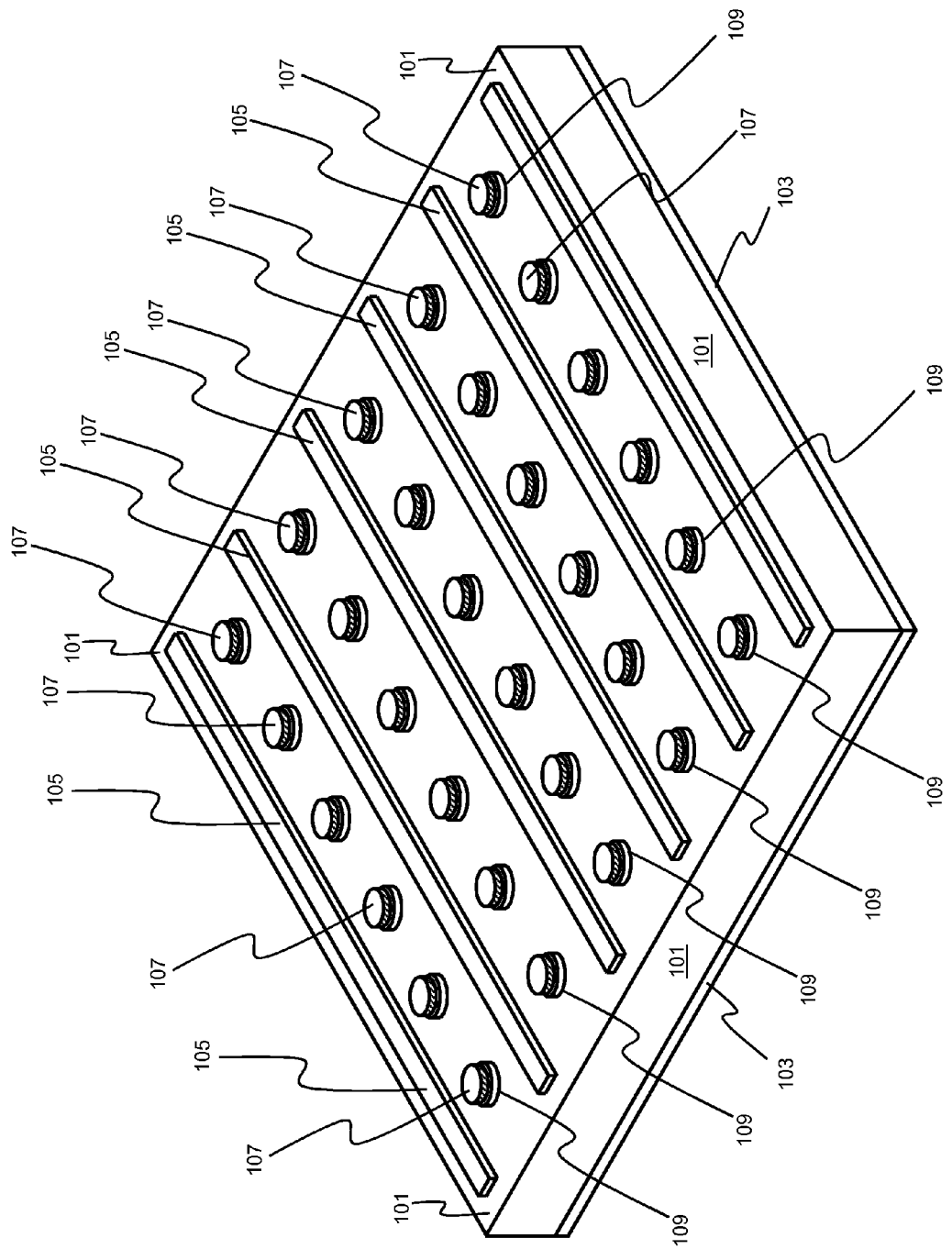
Figure 1C:
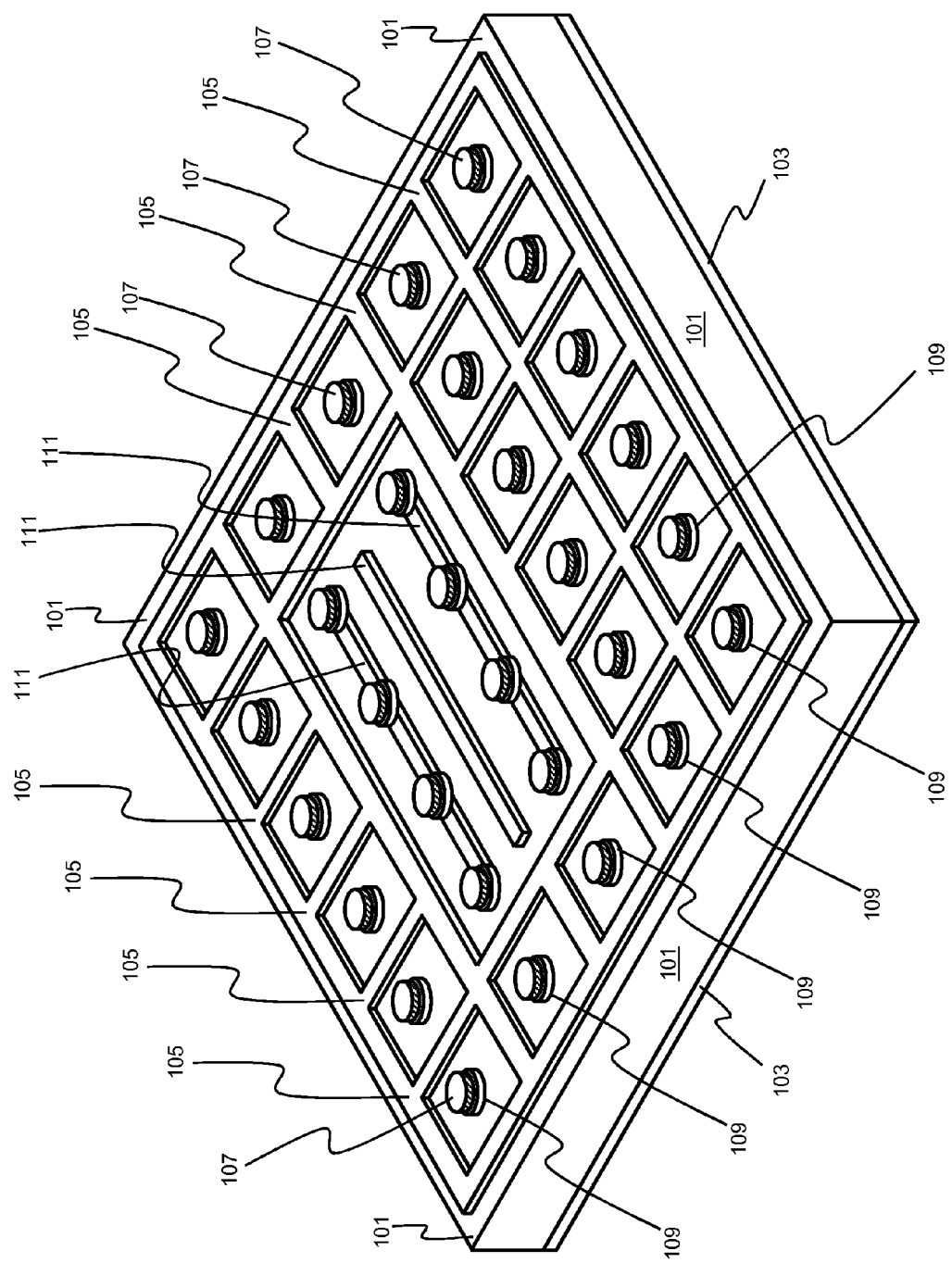
FIG. 1C schematically illustrates an example of a thinned TSV die having a RDL structure formed on the backside of the die to control warpage and a PDN RDL, in accordance with an exemplary embodiment.

Adverting to FIG. 1A (an axiomatic view), a thinned TSV die 101 of a 3D IC (not shown for illustrative convenience) is provided. In this example, a BEOL layer 103 is attached to the TSV die 101's front side. A plurality of RDL lines 105 are formed across the backside of the TSV die 101. The RDL lines 105 may be formed in a standard grid as depicted in FIG. 1A, a modified grid as depicted in FIG. 1C, in parallel as depicted in FIG. 1B, or as a plated layer with a plurality of openings (not shown for illustrative convenience). The RDL lines 105 are formed with a high compressive stress, as is inherent to a typical thin film metal plating process. The stress acts to compensate for front side film stresses from the BEOL layer 103 and/or a stack of BEOL layers 103 (now shown for illustrative convenience). The amount of stress may be tailored based on parameters such as plating temperature, final annealing temperatures, and the like, depending on final product requirements. The RDL lines 105 are formed of Cu and may be formed to a thickness of 0.25 µm to 10 µm, e.g., 0.25 um to 3 um. The RDL lines 105 are generally formed in a fairly symmetrical pattern, such as a grid, but can also be modified to provide custom levels of warpage compensation based on the product design. For example, the thickness and the width of the RDL lines 105 may be adjusted. In addition, the pattern of the RDL lines 105 may be adjusted or localized depending on a particular warpage shape.

A plurality of UBM structures 107 are also formed across the backside of the TSV die 101. Each UBM structure 107 may be formed of a bottom nickel (Ni) layer (closest to the TSV die 101) and a top gold (Au) layer (furthest from the TSV die 101). The UBM structures 107 may be formed between the RDL lines 105. Alternatively, the UBM structures 107 may be formed on the RDL lines 105.

For structures where the UBM structures 107 are formed between the RDL lines 105, a plurality of UBM captures pads 109 are first formed on the backside of the TSV die 101 between the RDL lines 105. The UBM capture pads 109 may be formed with at least 1 µm between each UBM capture pad 109 and the RDL lines 105. Because the RDL lines 105 and the UBM captures pads 109 are formed in a plating process rather than by a damascene process, the thicker the RDL lines 105 and UBM capture pads 109 are formed, the larger the gap between each UBM capture 109 and the RDL lines 105 needs to be. When present, the UBM capture pads 109 are also formed of Cu at the same time that the RDL lines 105 are formed. Thus, there are no additional process steps for forming the RDL lines 105. Once the UBM capture pads 109 are formed, the UBM structures 107 may be formed on top of the UBM capture pads 109.

FIG. 1B (an axiomatic view) is identical to FIG. 1A, except that the RDL lines 105 are formed in parallel rather than in a grid. The RDL lines 105 may be formed in parallel rather than a grid to prevent non-symmetrical warpage. Likewise, FIG. 1C (an axiomatic view) is almost identical to FIGS. 1A and 1B; except that the grid of RDL lines 105 in FIG. 1C has been modified so that a PDN RDL 111 may be formed on the backside of the TSV die 101. When present, the PDN RDL 111 is formed of Cu at the same time that the RDL lines 105 are formed. One or more UBM structures 107 may then be formed on the PDN RDL 111 and/or corresponding UBM capture pads 109.

The embodiments of the present disclosure can achieve several technical effects including controlling backside TSV die warpage and, therefore, ensuring a near flat surface for subsequent top die attachment; the RDL structure can be tailored to suit each individual design and subsequent warpage; and the RDL structure can be created at the same time as the backside UBM structures so that extra process steps are not required. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure is particularly applicable to packaging of TSV dies in 3D IC stacks.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
providing a thinned through silicon via (TSV) die of a three-dimensional (3D) integrated circuit (IC) stack, the thinned TSV die having a front side and a back side;
forming a plurality of redistribution layer (RDL) lines across the backside of the die; and
forming a plurality of under bump metal (UBM) structures across the backside of the die and between the

RDL lines, wherein the UBM structures are formed between the RDL lines by:
forming a plurality of UBM capture pads on the backside of the die between the RDL lines, the UBM capture pads being formed at the same time as the RDL lines are formed; and
forming each UBM structure on top of a UBM capture pad.

2. The method according to claim 1, comprising forming the RDL lines in a standard grid, a modified grid, in parallel, or as a plated layer with a plurality of openings.

3. The method according to claim 1, comprising forming the RDL lines with a high compressive stress.

4. The method according to claim 1, comprising forming the UBM capture pads with at least a 1 micrometer (μm) gap between each UBM capture pad and the RDL lines.

5. The method according to claim 1, comprising forming the UBM capture pads and the RDL lines of copper (Cu).

6. The method according to claim 1, further comprising forming a power delivery network redistribution layer (PDN RDL) between the RDL lines on the backside of the die.

7. The method according to claim 6, comprising forming one or more of the UBM structures on the PDN RDL.

8. A device comprising:
a thinned through silicon via (TSV) die of a three-dimensional (3D) integrated circuit (IC) stack, the TSV die having a front side and a back side;
a plurality of redistribution layer (RDL) lines formed across the backside of the die; and
a plurality of under bump metal (UBM) structures formed across the backside of the die and between the RDL lines, the UBM structures comprising:
a plurality of UBM capture pads between the RDL lines on the backside of the die between the RDL lines at the same time that the RDL lines are formed and each UBM structure is formed on top of a UBM capture pad.

9. The device according to claim 8, wherein the RDL lines are formed in a standard grid, a modified grid, in parallel, or as a plated layer with a plurality of openings.

10. The device according to claim 8, wherein the RDL lines are formed with a high compressive stress.

11. The device according to claim 8, wherein the UBM capture pads are formed with at least a 1 micrometer (μm) gap between each UBM capture pad and the RDL lines.

12. The device according to claim 8, wherein the UBM capture pads and the RDL lines are formed of copper (Cu).

13. The device according to claim 8, wherein a power delivery network redistribution layer (PDN RDL) is formed between the RDL lines on the backside of the die.

14. The device according to claim 13, wherein one or more of the UBM structures are formed on the PDN RDL.

15. A method comprising:
providing a thinned through silicon via (TSV) die of a three-dimensional (3D) integrated circuit (IC) stack, the thinned TSV die having a front side and a back side;
forming a plurality of redistribution layer (RDL) lines across the backside of the die, the RDL lines being formed of copper (Cu) with a high compressive stress and in a standard grid, a modified grid, in parallel, or as a plated layer with a plurality of openings;
forming a plurality of under bump metal (UBM) capture pads of Cu on the backside of the die, the plurality of UBM capture pads being formed at the same time as the RDL lines are formed and with at least a 1 micrometer (μm) gap between each UBM capture pad and the RDL lines; and
forming a plurality of UBM structures across the backside of the die, each UBM structure formed on top of a UBM capture pad.

16. The method according to claim 15, wherein the RDL lines are formed in a modified grid, the method further comprising:
forming a power delivery network redistribution layer (PDN RDL) between the RDL lines on the backside of the die; and
forming one or more of the UBM structures on the PDN RDL.

\* \* \* \* \*